United States Patent
Kim

(10) Patent No.: US 10,291,186 B2
(45) Date of Patent: May 14, 2019

(54) AMPLIFIER FOR CONTORLLING OUTPUT RANGE AND MULTI-STAGE AMPLIFICATION DEVICE USING THE SAME

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/817,527

(22) Filed: Nov. 20, 2017

(65) Prior Publication Data

US 2018/0145639 A1 May 24, 2018

(30) Foreign Application Priority Data

Nov. 24, 2016 (KR) .................. 10-2016-0157290

(51) Int. Cl.
- H03F 1/26 (2006.01)
- H03F 3/45 (2006.01)
- H03F 1/30 (2006.01)
- H03F 3/30 (2006.01)
- H01L 27/146 (2006.01)

(52) U.S. Cl.
CPC .............. *H03F 1/26* (2013.01); *H03F 1/308* (2013.01); *H03F 3/3028* (2013.01); *H03F 3/45* (2013.01); *H03F 3/45475* (2013.01); *H01L 27/14643* (2013.01); *H03F 2200/441* (2013.01); *H03F 2203/30084* (2013.01); *H03F 2203/30117* (2013.01); *H03F 2203/45051* (2013.01); *H03F 2203/45116* (2013.01); *H03F 2203/45138* (2013.01); *H03F 2203/45156* (2013.01); *H03F 2203/45186* (2013.01)

(58) Field of Classification Search
CPC ........................................................ H03F 1/26
See application file for complete search history.

(56) References Cited

FOREIGN PATENT DOCUMENTS

| KR | 100645926 | 11/2006 |
|---|---|---|
| KR | 1020110093151 | 8/2011 |

*Primary Examiner* — Patricia T Nguyen
(74) *Attorney, Agent, or Firm* — IP & T Group LLP

(57) ABSTRACT

An amplifier includes a differential amplification block suitable for receiving and amplifying a first differential input signal and a second differential input signal; an output block suitable for determining an output signal according to a state of amplified signals outputted from the differential amplification block; and an output range restriction block suitable for controlling an output range of the output signal outputted from the output block based on a maximum clamping signal and a minimum clamping signal.

14 Claims, 4 Drawing Sheets

US 10,291,186 B2

AMPLIFIER FOR CONTORLLING OUTPUT RANGE AND MULTI-STAGE AMPLIFICATION DEVICE USING THE SAME

CROSS-REFERENCE TO RELATED APPLICATION

The present application claims priority of Korean Patent Application No. 10-2016-0157290, filed on Nov. 24, 2016, which is incorporated herein by reference in its entirety.

TECHNICAL FIELD

Exemplary embodiments of the present disclosure relate to an amplifier for controlling an output range and a multi-stage amplification device using the same. Particularly, exemplary embodiments of the present disclosure relate to an amplifier capable of controlling an output range without the reduction of a gain value, and a multi-stage amplification device using the same.

DISCUSSION OF THE RELATED ART

In general, an ideal amplifier may have an unlimited gain and be able to control its output range by detecting the output voltage.

In addition, a multi-stage amplification device having a plurality of amplifiers, which are coupled to each other in series, is generally used for amplifying an input signal in multi-stages.

As for a multi-stage amplifier, the output range of each amplifier is determined by the difference value between input voltages from the previous stage amplifier. On the one hand, when the difference value between input voltages from the previous stage amplifier is lower than a predetermined value (e.g., when the output voltage of the previous stage amplifier is inputted to the next stage amplifier so that the output voltage of the next stage amplifier has a voltage value between the ground voltage and the power supply voltage due to the difference between input voltages from the previous stage amplifier), the output voltage of the next stage amplifier exists between the ground voltage VSS and the power supply voltage VDD, On the other hand, however, when the difference value between input voltages from the previous stage amplifier is higher than a predetermined value (e.g., when the output voltage of the previous stage amplifier is inputted to the next stage amplifier so that the output voltage of the post-stage amplifier has a voltage that is either lower than the ground voltage or higher than the power supply voltage), the output voltage of the next stage amplifier has either the ground voltage VSS or the power supply voltage VDD due to clamping by the ground voltage VSS or the power supply voltage VDD.

If the variation of the output voltage caused by the input voltages is greatly increased, power consumption and noise would likely increase due to a large current induced during the operation.

As far as noise is concerned, it may be coupling noise caused by a coupling parasitic capacitor or power noise caused by large current.

In addition, for a complementary metal-oxide-semiconductor (CMOS) image sensor using a number of analog-to-digital converts for column parallel outputs, the above-described noise may cause an adverse influence on the data conversion of neighboring columns.

SUMMARY

Various embodiments are directed to an amplifier for controlling an output range by using a maximum clamping voltage and a minimum clamping voltage to solve adverse effects including noise and power consumption caused by the wide output variation of an amplifier, and a multi-stage amplification device using the same.

In an embodiment, an amplifier may include a differential amplification block suitable for receiving and amplifying a first differential input signal and a second differential input signal; an output block suitable for determining an output signal according to a state of amplified signals outputted from the differential amplification block; and an output range restriction block suitable for controlling an output range of the output signal outputted from the output block based on a maximum clamping signal and a minimum clamping signal.

In an embodiment, a multi-stage amplification device may include a first stage amplifier suitable for receiving and amplifying a first differential input signal and a second differential input signal, and for controlling an output range of an output signal based on a maximum damping signal and a minimum damping signal, n stage amplifiers, each suitable for receiving and amplifying differential input signals provided from a previous stage amplifier included in the n stage amplifiers, and for controlling an output range of an output signal based on an nth maximum clamping signal and an n-th minimum clamping signal, where n is a natural number greater than one; and a control unit suitable for monitoring the output signal outputted from the first stage amplifier and each of the n stage amplifiers, determining corresponding maximum clamping signals and corresponding minimum clamping signals according to an output voltage state of the output signal, and for providing the corresponding maximum clamping signals and the corresponding minimum clamping signals to the first stage amplifier and each of the n stage amplifiers.

In an embodiment, an amplifier may include a differential amplification block suitable for receiving and amplifying differential input signals; an output block connected to the differential amplification block and suitable for determining an output signal according to, a state of amplified signals outputted from the differential amplification block; a output node connected to the output block and suitable for outputting the output signal; and a output voltage restriction block including at least one switch connected between the output node and the output block and suitable for switching on or off in response to a determination that the output signal is higher or lower than a target voltage.

DETAILED DESCRIPTION

Figure 1A:
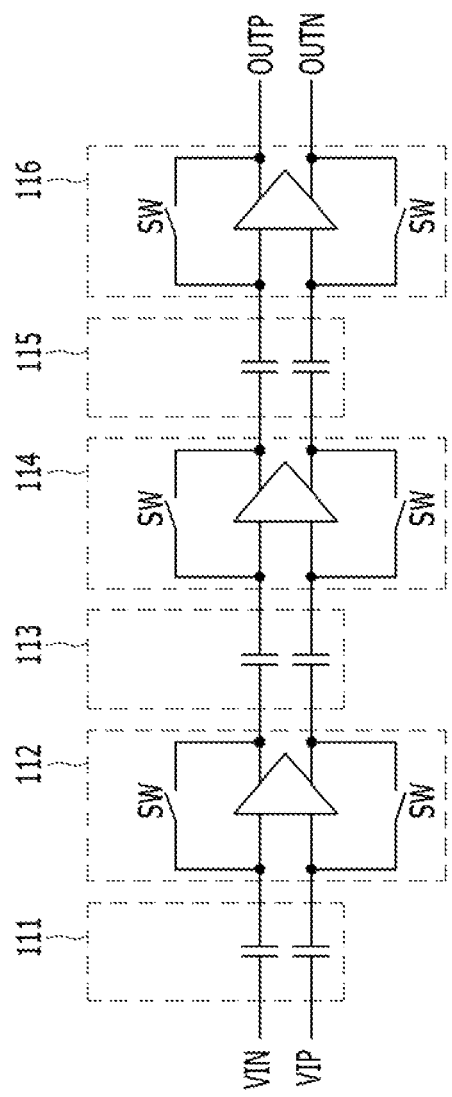
FIG. 1A is a diagram illustrating a multi-stage amplification device having a plurality of amplifiers in accordance with one embodiment of the present disclosure.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

It will be understood that when an element is referred to as being "coupled" to another element, it may be directly coupled to the element or electrically coupled thereto with other elements interposed therebetween. Furthermore, when an element is referred to as "comprising" or "including" a component, it does not preclude another component but may further include other components unless the context clearly indicates otherwise. The terminology used herein is for the purpose of describing particular embodiments only and is not intended to be limiting.

Figure 1B:
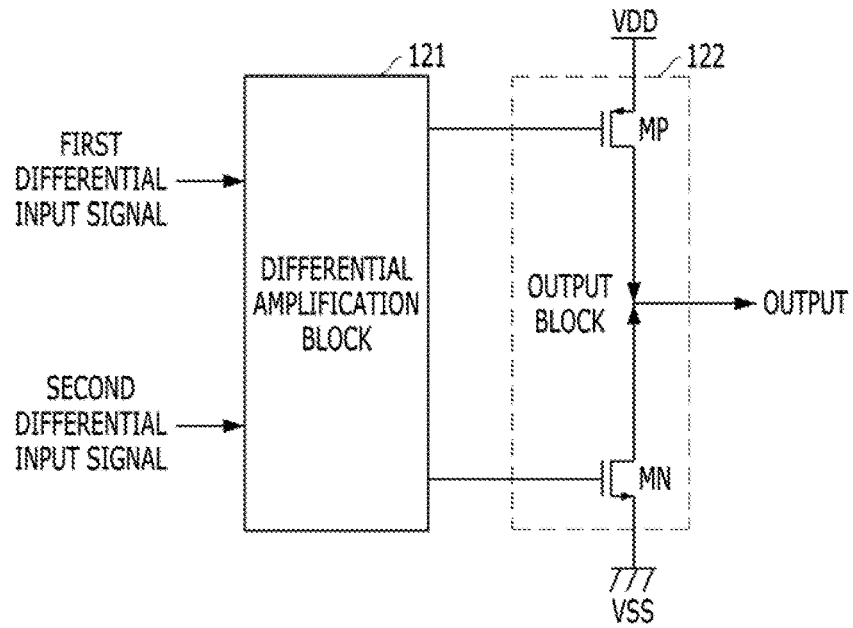
FIG. 1B is a diagram illustrating one of the plurality of amplifiers shown in FIG. 1A.
Figure 1C:
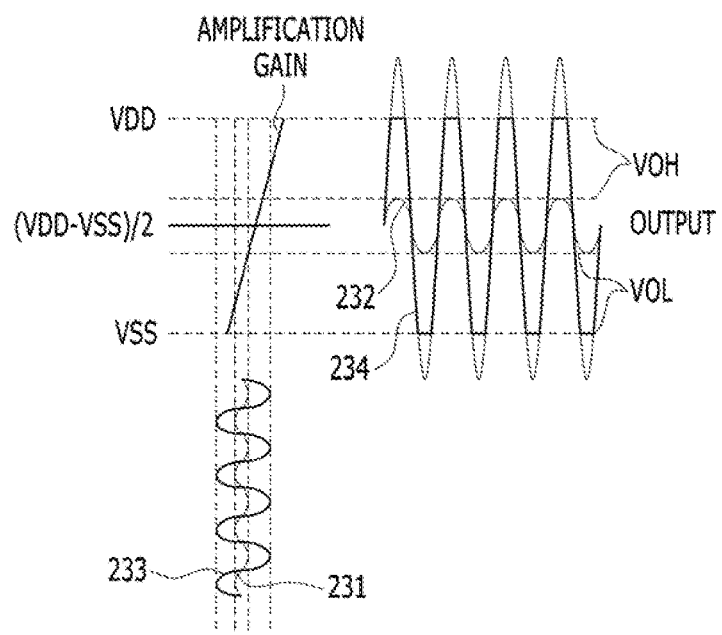
FIG. 1C is a diagram illustrating an input signal and an output signal of the amplifier shown in FIG. 1B.

FIG. 1A is a diagram illustrating a multi-stage amplification device having a plurality of amplifiers that are serially coupled to each other according to one embodiment. FIG. 1B is a diagram illustrating one of the plurality of amplifiers shown in FIG. 1A. FIG. 1C is a diagram illustrating an input signal and an output signal of the amplifier shown in FIG. 1B.

Referring to FIG. 1A, a multi-stage amplification device having a plurality of amplifiers that are serially coupled to each other, includes a first capacitor block 111, a first stage amplifier 112, a second capacitor block 113, a second stage amplifier 114, a third capacitor block 115, and a third stage amplifier 116.

The first capacitor block 111 performs a direct current (DC) blocking operation and a required operation, e.g., a correlated double sampling (CDS) operation for a CMOS image sensor, on a first input signal VIN and a second input signal VIP.

The first stage amplifier 112 amplifies the first input signal VIN and the second input signal VIP. The first input signal VIN and the second input signal VIP may be a first differential input signal and a second differential input signal.

The second capacitor block 113 performs a direct current blocking operation on the amplification signal outputted from the first stage amplifier 112. The second stage amplifier 114 amplifies differential input signals inputted from the second capacitor block 113.

The third capacitor block 115 performs a direct current blocking operation on the amplification signal outputted from the second stage amplifier 114. The third stage amplifier 116 amplifies differential input signals inputted from the third capacitor block 115.

More specifically, a multi-stage amplification having a plurality of amplifiers 112, 114, and 116 coupled to each other in series may be performed to amplify a very small signal and process data as follows. When the switches of the amplifiers are turned on respectively, the amplifiers are initialized. Then if differential input signals including a first input signal VIN and a second input signal VIP are inputted, each amplifier performs an amplification operation according to values of the inputted differential input signals, and the overall multi-stage amplification outputs a first output signal OUTP and a second output signal OUTN.

The difference value between differential input signals varies and may be lower than a predetermined value or higher than the predetermined value. As a result, the output ranges of the amplifiers to may be different from each other. Therefore, the multi-stage amplification device having a plurality of amplifiers may have adverse effects such as noise and power consumption caused by the large variation of output voltages according to the difference value of the differential input signals.

Referring to FIG. 1B, one of the plurality of amplifiers shown in FIG. 1A includes a differential amplification block 121 and an output block 122 according to one embodiment.

The differential amplification block 121 receives and differentially amplifies a first differential input signal and a second differential input signal. The differential amplification block 121 may be implemented using any suitable differential amplification hardware circuit such as an operational amplifier, for instance.

The output block 122 determines an output voltage of an output signal OUTPUT according to a state of two amplified signals outputted from the differential amplification block 121. The output block 122 includes a PMOS transistor MP and an NMOS transistor MN, Although only the PMOS transistor MP and the NMOS transistor MN are described according to one embodiment, various embodiments of the present disclosure are not limited to those examples, and any suitable type of electronic components may be used appropriately in the output block 122.

In accordance with one exemplary embodiment, the PMOS transistor MP receives a power supply voltage VDD through its source terminal, and the drain terminal of the PMOS transistor MP is coupled to an output terminal. The PMOS transistor MP receives a first amplified signal of the two amplified signals outputted from the differential amplification block 121 through the gate of the PMOS transistor MP, and operates in response the first amplified signal.

The NMOS transistor MN receives a ground voltage VSS through its source terminal, and the drain terminal of the NMOS transistor NP is coupled to the output terminal for outputting the output signal OUTPUT. The NMOS transistor NP receives a second amplified signal of the two amplified signals outputted from the differential amplification block 121 through the gate of the NMOS transistor NP, and operates in response to the second amplified signal.

The amplifier shown in FIG. 1B may be a single amplifier, or may be a one-stage amplifier included in a multi-stage amplification device shown in FIG. 1A.

Herein, since the amplifier shown in FIG. 1B may have a configuration with a relatively high impedance, the output voltage of the amplifier shown in FIG. 18 may vary between a ground voltage VSS and a power supply voltage VDD according to the state of the two amplified signals outputted from the differential amplification block 121. In most cases, the output voltage of the amplifier is likely to have the ground voltage VSS or the power supply voltage VDD.

Referring to FIG. 1C, if the difference value between the differential input signals is lower than a predetermined value 231, the output voltage 232 of the amplifier has a value amplified by the amount of "(a second differential signal−a first differential signal)×an amplification gain value".

On the other hand, if the difference value between the differential input signals is higher than a predetermined value 233, a maximum output voltage VOH is limited to the power supply voltage VDD. and a minimum output voltage VOL is limited to the ground voltage VSS since the output voltage is clamped by the power supply voltage VDD and the ground voltage VSS.

Referring to FIG. 1A, if the output voltage of the first stage amplifier 112 is higher than a predetermined value, the output voltage of the second stage amplifier 114 is clamped by the power supply voltage VDD and the ground voltage VSS and thus is outputted as the power supply voltage or the ground voltage VSS. That is, if the output voltage of the first stage amplifier 112 is higher than a predetermined value, the difference value of the differential input signals is irrelevant to the amplification gain of the post-stage amplifier including the second amplifier 114 and the third amplifier 116.

Thus, when the difference value of the differential input signals is higher than the predetermined value, the amplifier may have the same characteristics, even if the amplifier is not designed to have an output range exceeding the ground voltage VSS or the power supply voltage VDD.

Therefore, it is not preferable that an amplifier has a variation of the output range greater than a required output range. That is, if the output voltage changes widely by the difference of the differential input signals, the amplifier may suffer issues as follows: a large amount of current flows during its operation; power consumption increases; and noise occurs.

As for noise, it may include, for example, coupling noise generated by a coupling parasitic capacitor and power noise that is generated by excessive current.

As far as a CMOS image sensor having a number of analog-to-digital converters (ADC) for a column parallel output is concerned, the above-described noise may adversely affect the data conversion of neighboring columns. Also, because of the increased power consumption, the characteristics of the ADC may deteriorate, and due to the heat radiation of the chip including the ADC, the reliability of the chip may be degraded.

In exemplary embodiments of the present invention, issues such as unwanted noise and the increased power consumption which are caused by the output variation of differential input signals of the amplifier, can be reduced by controlling the output range of an amplifier using a maximum clamping voltage and a minimum clamping voltage.

Hereinafter, more detailed descriptions will follow with reference to FIGS. 2A to 4.

Figure 2A:
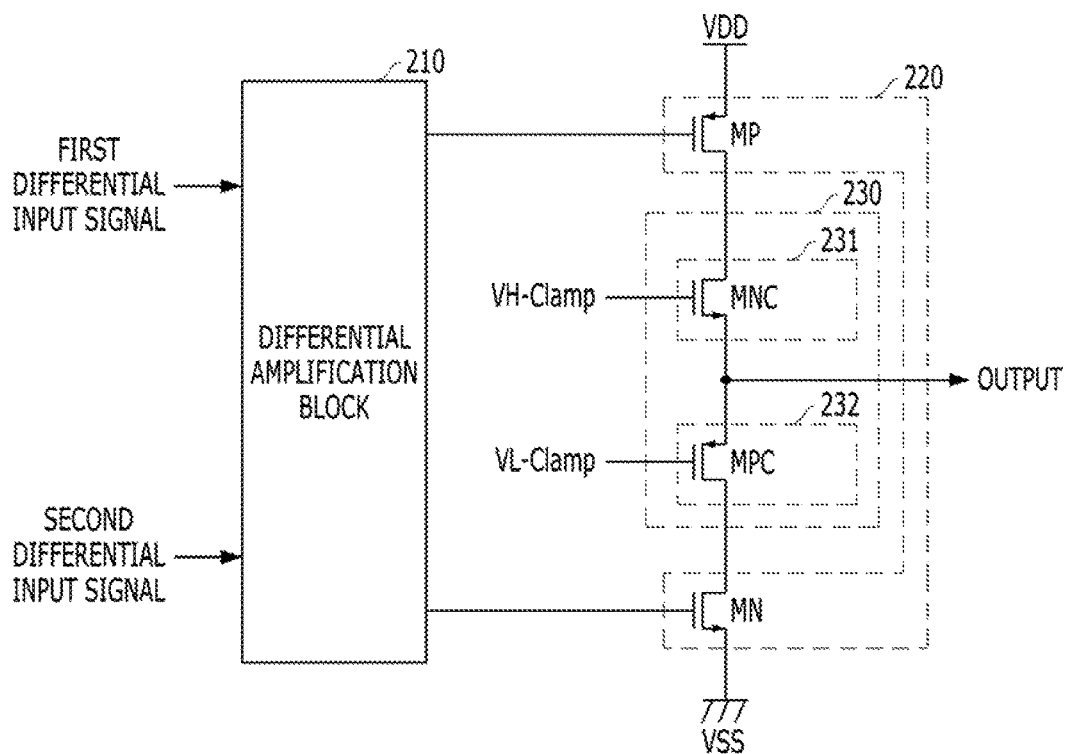
FIG. 2A is a diagram illustrating an amplifier for controlling an output range in accordance with an embodiment of the present disclosure.
Figure 2B:
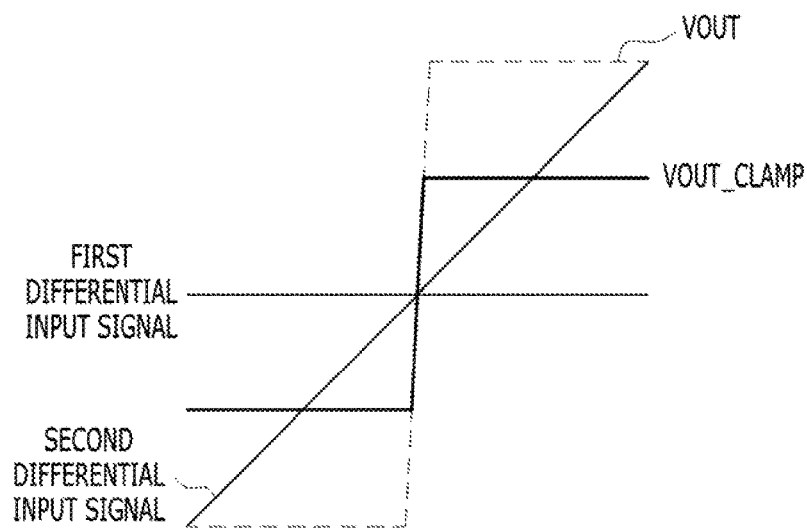
FIG. 2B is a diagram illustrating an input signal and an output signal of the amplifier shown in FIG. 2A in accordance with an embodiment of the present disclosure.

FIG. 2A is a diagram illustrating an amplifier for controlling an output range in accordance with an embodiment of the present disclosure. FIG. 2B is a diagram illustrating an input signal and an output signal of the amplifier shown in FIG. 2A in accordance with an embodiment of the present disclosure.

Referring to FIG, 2A, an amplifier for controlling an output range in accordance with an embodiment of the present invention may include a differential amplification block 210, an output block 220, and an output range control block 230. The output range control block 230 may include a maximum control unit 231 and a minimum control unit 232.

The amplification block 210 receives and amplifies a first differential input signal and a second differential input signal, The differential amplification block 210 may include any suitable differential amplification hardware circuit such as an operational amplifier, for instance.

The output block 220 determines an output signal OUTPUT according to the state of two amplified signals outputted from the differential amplification block 210. The output block 220 may include a PMOS transistor MP and an NMOS transistor MN.

The PMOS transistor MP receives a power supply voltage VDD through the source terminal of the PMOS transistor MP, and the drain terminal of the PMOS transistor MP is coupled to the maximum control unit 231 of the output range control block 230. The PMOS transistor MP receives a first amplified signal of the two amplified signals outputted from the differential amplification block 210 through the gate of the PMOS transistor MP, and operates in response the first amplified signal.

The NMOS transistor MN receives a ground voltage VSS through its source terminal, and the drain terminal of the NMOS transistor MN is coupled to the minimum control unit 232 of the output range control block 230. The NMOS transistor MN receives a second amplified signal of the two amplified signals outputted from the differential amplification block 12 through the gate of the NMOS transistor MN, and operates in response to the second amplified signal.

The maximum control unit 231 of the output range control block 230 controls the maximum output value of a first output signal outputted from the output block 220 according to a maximum clamping signal VH-Clamp provided from a control unit (not shown). The maximum control unit 231 may include an NMOS transistor MNC for controlling the maximum output value of the first output signal outputted from the output block 220. The drain terminal of the NMOS transistor MNC is coupled to the output block 220, and the source terminal of the NMOS transistor MNC is coupled to the output terminal for outputting an output signal OUTPUT. The NMOS transistor MNC operates according to the maximum clamping signal VH-Clamp received from the control unit (not shown) through the gate terminal of the NMOS transistor MNC.

The minimum control unit 232 of the output range control block 230 controls the minimum output value of a second output signal outputted from the output block 220 according to a minimum clamping signal VL-Clamp provided from the control unit (not shown). The minimum control unit 232 may include the PMOS transistor MPC for controlling the minimum output value of the second output signal outputted from the output block 220. The drain terminal of the PMOS transistor MPC is coupled to the output block 220, and the source terminal of the PMOS transistor MPC is coupled to the output terminal for outputting the output signal OUTPUT. The PMOS transistor MPC operates according to the minimum clamping signal VL-Clamp received from the control unit (not shown) through the gate terminal of the PMOS transistor MPC.

Herein, the maximum clamping signal VH-Clamp and the minimum clamping signal VL-Clamp are values that determine the output range by restricting the maximum value and the minimum value. During an initial setting process, the maximum damping signal VH-Clamp and the minimum damping signal VL-Clamp may be determined according to the state of the output voltage, which is acquired by detecting and setting the output signal, or consistently monitoring the output signal. The maximum clamping signal VH-Clamp and the minimum clamping signal VL-Clamp may be provided from an internal control unit (referring to FIG. 4) or an external control unit (not shown), e.g., a timing generator.

Referring to FIG. 2B, for an amplifier that is not capable of controlling its output range, when the first differential input signal and the second differential input signal are inputted, an output voltage VOUT of the output signal is outputted because the output range is unlimited (i.e., dashed lines). However, for an amplifier that is capable of controlling its output range, when the first differential input signal and the second differential input signal are inputted, because the output range is restricted according to the maximum clamping signal VH-Clamp and the minimum clamping signal VL-Clamp are restricted, an output signal having a restricted output range VOUT_CLAMP is outputted (i.e., solid lines).

That is, if the voltage value of the output, signal is higher than the maximum value, the NMOS transistor MNC controlled by the maximum clamping signal VH-Clamp is turned off and blocks the increase of the output voltage. If the voltage value of the output signal is lower than the minimum value, the PMOS transistor MPC controlled by the minimum clamping signal VL-Clamp is turned off and blocks the decrease of the output voltage.

Herein, the maximum value of the output signal is determined by "the maximum clamping signal VH-clamp-a threshold voltage value of the NMOS transistor MNC". The minimum value of the output signal is determined by "the minimum clamping signal VL-Clamp-a threshold voltage value of the PMOS transistor MPC".

In accordance with one embodiment, the impedance value at the output terminal increases slightly because the MOS transistor MPC and the NMOS transistor MNC are added. However, because the increased value of the impedance at the output terminal is very low in comparison with the output impedance of an amplifier without the transistors MPC, MNC, the value of the output impedance can be maintained similarly. That is, the gain value of the amplifier is hardly decreased.

Figure 3:
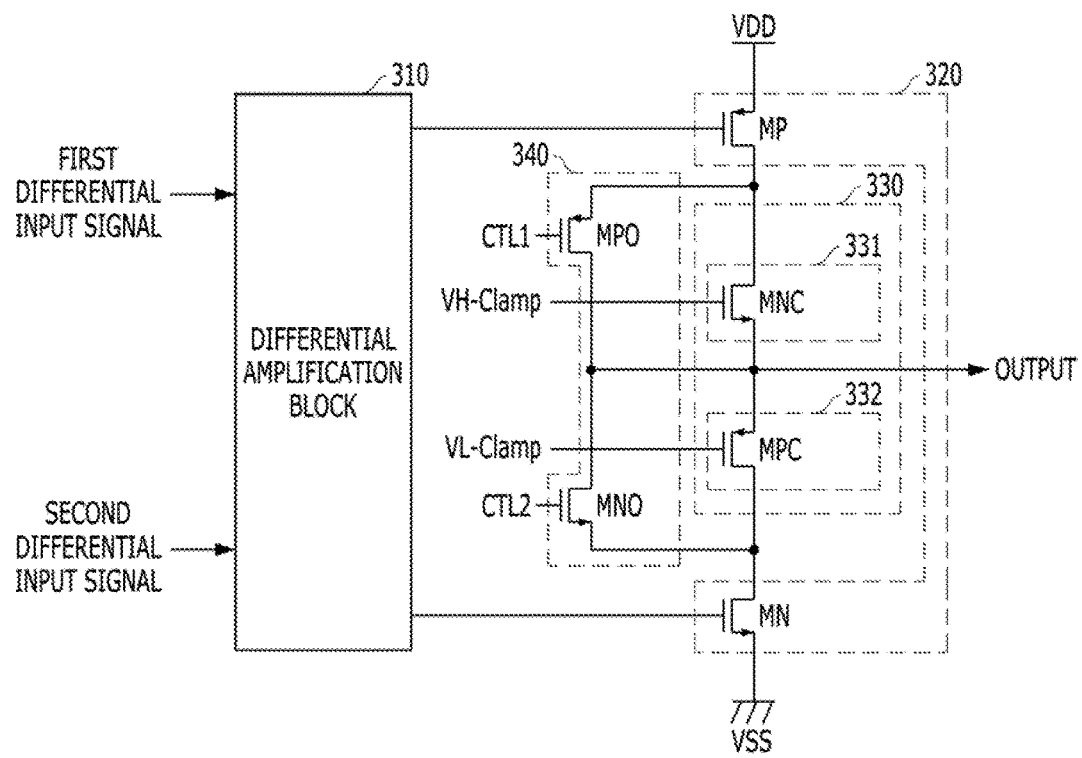
FIG. 3 is a diagram illustrating an amplifier for controlling an output range in accordance with another embodiment of the present disclosure.

FIG. 3 is a diagram illustrating an amplifier for controlling an output range in accordance with another embodiment of the present disclosure.

The amplifier for controlling an output range in accordance with another embodiment of the present disclosure may include a differential amplification block 310, an output block 320, an output range control block 330, and an output range restriction release block 340. The output range control block 330 may include a maximum control unit 331 and a minimum control unit 332.

Since the operations and the configurations of the differential amplification block 310, an output block 320, and an output range control block 330 are substantially the same as the differential amplification block 210, the output block 220, and the output range control block 230 shown in FIG. 2A, the detailed descriptions of the differential amplification block 310, an output block 320, and an output range control block 330 will not be repeated.

The output range restriction release block 340 may include a PMOS transistor MPO and an NMOS transistor MNO, and releases the output range restriction of the output range restriction block 330 according to a first control signal CTL1 and a second control signal CTL2. Although only the PMOS transistor MPO and the NMOS transistor MNO are described according to one embodiment, various embodiments of the present disclosure are not limited to those examples, and any suitable type of electronic components may be used appropriately to the output range restriction release block 340.

The output range restriction release block 340 may be implemented with a switching block, which is switched according to the first control signal CTL1 and the second control signal CTL2. The switching block may include a path between the output block 320 and the output terminal such that the output range restriction operation of the output range restriction block 330 is released or bypassed.

The source terminal of the PMOS transistor MPO is coupled to the drain of the PMOS transistor MP of the output block 320 and the drain terminal of the PMOS transistor MPO is coupled to the output terminal for outputting the output signal OUTPUT. The PMOS transistor operates according to the first control signal CTL1 received from an external control unit (not shown) through the gate terminal of the PMOS transistor MPO.

The source terminal of the NMOS transistor MNO is coupled to the drain of the NMOS transistor MN of the output block 320, and the drain terminal of the NMOS transistor MNO is coupled to the output terminal for outputting the output signal OUTPUT. The NMOS transistor operates according to the second control signal CTL2 received from an external control unit (not shown) through the gate terminal of the NMOS transistor MNO.

The amplifier for controlling an output range in accordance with another embodiment of the present invention may control the output range of the amplifier, depending on the designed function of the amplifier, by adding the output range restriction release block 340.

Figure 4:
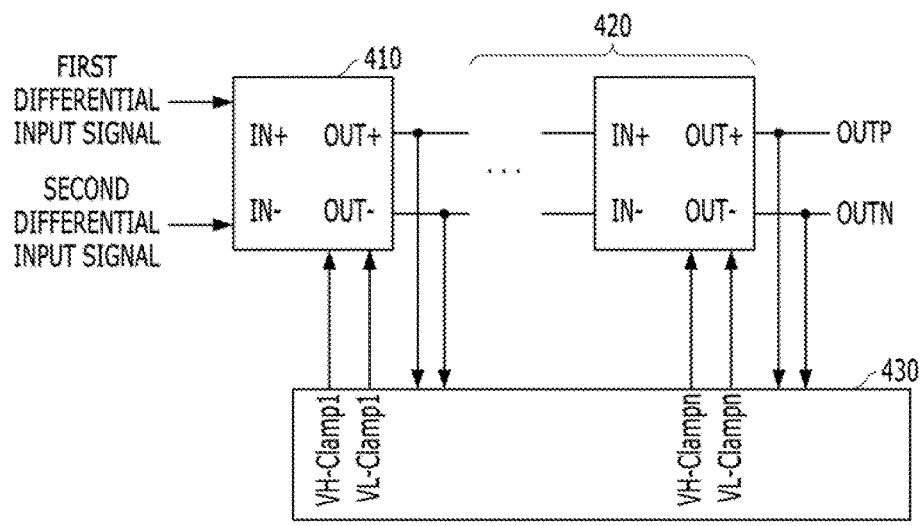
FIG. 4 is a diagram Illustrating a multi-stage amplification device having a plurality of amplifiers for controlling an output range in accordance with another embodiment of the present disclosure.

FIG. 4 is a diagram illustrating a multi-stage amplification device having a plurality of amplifiers for controlling an output range in accordance with another embodiment of the present disclosure.

Referring to FIG. 4, a multi-stage amplification device having a plurality of amplifiers for controlling an output range in accordance with another embodiment of the present disclosure may include a first stage amplifier 410, n stage amplifiers 420, where n is a natural number greater than one, and a control unit 430.

The first stage amplifier 410 receives and amplifies a first differential input signal and a second differential input signal. The first stage amplifier 410 controls the output range of the output signal using a first maximum clamping signal VH-Clamp1 and a first minimum clamping signal VL-Clamp1.

Each of the n stage amplifiers 420 receives and amplifies differential input signals outputted from a previous stage amplifier. Each of the n stage amplifiers 420 controls the output range of the output signal OUTP and OUTN using an nth maximum clamping signal VH-Clampn and an n-th minimum Clamping signal VL-Clampn.

The control unit 430 monitors the output signal OUTP and OUTN outputted from each of the first stage amplifier 410 and the n amplifiers, determines a corresponding maximum clamping signal and a corresponding minimum damping signal according to the output voltage of the monitored output signal, and provides the determined maximum clamping signal and the determined minimum damping signal to each amplifier.

More specifically, the control unit 430 monitors the output signal OUTP and OUTN, determines the maximum clamping signal to prevent the voltage increase of the output signal OUTP and OUTN if the voltage value of the output signal OUTP and OUTN is higher than the maximum value, and determines the minimum clamping signal to prevent the voltage decrease of the output signal OUTP and OUTN if the voltage value of the output signal OUTP and OUTN is lower than the minimum value. Thus, the control unit 430 may control the output range of the output signal OUTP and OUTN more correctly by monitoring the output signal OUTP and OUTN.

In accordance with one embodiment, the control unit 430 may be omitted, and instead an external control unit (not shown) may be used, for example, for the purpose of detecting the output signal and setting the maximum clamping signal and the minimum clamping signal during an initialization process of the semiconductor device.

An amplifier and a multi-stage amplification device in accordance with various embodiments of the present disclosure may reduce power consumption and restrict power noise and coupling noise by controlling the output range of the amplifiers.

Moreover, an amplifier and a multi-stage amplification device in accordance with various embodiments of the present disclosure may be efficiently applied to a circuit, which is capable of using a high output resistance characteristic on differential input signals having an input difference value lower than a predetermined value, while being capable of obtaining a small output range without a large amplification gain when the difference value of the differential input signals is higher than the predetermined value.

Although various embodiments have been described for illustrative purposes, it will be apparent to those skilled in the art that various changes and modifications may be made without departing from the spirit and scope of the disclosure as defined in the following claims.

What is claimed is:

1. An amplifier, comprising:
    a differential amplification block suitable for receiving and amplifying a first differential input signal and a second differential input signal;
    an output block suitable for determining an output signal according to a state of amplified signals outputted from the differential amplification block;
    an output range restriction block suitable for controlling an output range of the output signal outputted from the output block based on a maximum clamping signal and a minimum clamping signal; and
    an output range restriction release block suitable for releasing an output range restriction operation of the output range restriction block according to a first control signal or a second control signal.

2. The amplifier of claim 1, wherein the output range restriction block includes:
    a maximum control unit suitable for controlling a maximum value of the output signal outputted from the output block according to the maximum clamping signal provided from a control unit; and
    a minimum control unit suitable for controlling a minimum value of the output signal outputted from the output block according to the minimum clamping signal provided from the control unit.

3. The amplifier of claim 2, wherein the maximum control unit includes an NMOS transistor having a drain terminal coupled to the output block and a source terminal coupled to an output terminal for outputting the output signal, and wherein the NMOS transistor controls the maximum value of the output signal outputted from the output block, and operates according to the maximum clamping signal received from the control unit through a gate terminal of the NMOS transistor.

4. The amplifier of claim 2, wherein the minimum control unit includes a PMOS transistor having a drain terminal coupled to the output block and a source terminal coupled to an output terminal for outputting the output signal, and wherein the NMOS transistor controls the minimum value of the output signal outputted from the output block, and operates according to the minimum clamping signal received from the control unit through a gate terminal of the PMOS transistor.

5. The amplifier of claim 2, wherein the maximum clamping signal and the minimum clamping signal are set based on a detection of the output signal during an initialization process, or are determined according to an output voltage state of the output signal based on monitoring of the output signal.

6. The amplifier of claim 1, wherein the output range restriction release block includes a switching block, which is switched according to the first control signal and the second control signal, and wherein the switching block includes a path for releasing the output range restriction operation of the output range restriction block between the output block and the output terminal.

7. The amplifier of claim 6, wherein the switching block includes:
    a PMOS transistor having a source terminal coupled to the output block and a drain terminal coupled to the output terminal, and suitable for operating according to the first control signal provided from outside through a gate terminal of the PMOS transistor; and
    an NMOS transistor having a source terminal coupled to the output block and a drain terminal coupled to the output terminal, and suitable for operating according to the second control signal provided from outside through a gate terminal of the NMOS transistor.

8. A multi-stage amplification device, comprising:
    a first stage amplifier suitable for receiving and amplifying a first differential input signal and a second differential input signal, and for controlling an output range of an output signal based on a maximum clamping signal and a minimum clamping signal;
    n stage amplifiers, each suitable for receiving and amplifying differential input signals provided from a previous stage amplifier included in the n stage amplifiers, and for controlling an output range of an output signal based on an n-th maximum clamping signal and an n-th minimum clamping signal, where n is a natural number greater than one; and
    a control unit suitable for monitoring the output signal outputted from the first stage amplifier and each of the n stage amplifiers, for determining corresponding maximum clamping signals and corresponding minimum clamping signals according to an output voltage state of the output signal, and for providing the corresponding maximum clamping signals and the corresponding minimum clamping signals to the first stage amplifier and each of the n stage amplifiers,
    wherein each of the first stage amplifier and the n stage amplifiers comprises:
    a differential amplification block suitable for receiving and amplifying the first differential input signal and the second differential input signal, or the differential input signals;
    an output block suitable for determining the output signal according to a state of amplified signals outputted from the differential amplification block;
    an output range restriction block suitable for controlling the output range of the output signal outputted from the output block using a maximum clamping signal and a minimum clamping signal provided from the control unit; and
    an output range restriction release block suitable for releasing an output range restriction operation of the output range restriction block according to a first control signal or a second control signal.

9. The multi-stage amplifier of claim 8, wherein the output range restriction block includes:

a maximum control unit suitable for controlling a maximum value of the output signal outputted from the output block according to the maximum clamping signal provided from a control unit; and a minimum control unit suitable for controlling a minimum value of the output signal outputted from the output block according to the minimum clamping signal provided from the control unit.

10. The multi-stage amplifier of claim 9, wherein the maximum control unit includes an NMOS transistor having a drain terminal coupled to the output block and a source terminal coupled to an output terminal for outputting the output signal, and wherein the NMOS transistor controls the maximum value of the output signal outputted from the output block and operates according to the maximum clamping signal received from the control unit through a gate terminal of the NMOS transistor.

11. The multi-stage amplifier of claim 9, wherein the minimum control unit includes a PMOS transistor having a drain terminal coupled to the output block and a source terminal coupled to an output terminal for outputting the output signal, and wherein the NMOS transistor controls the minimum value of the output signal outputted from the output block and operates according to the minimum clamping signal received from the control unit through a gate terminal of the PMOS transistor.

12. The multi-stage amplifier of claim 8, wherein the output range restriction release block includes a switching block, which is switched according to the first control signal and the second control signal, and wherein the switching block includes a path for releasing the output range restriction operation of the output range restriction block between the output block and the output terminal.

13. The amplifier of claim 12, wherein the switching block includes:

a PMOS transistor having a source terminal coupled to the output block and a drain terminal coupled to the output terminal, and suitable for operating according to the first control signal provided from outside through a gate terminal of the PMOS transistor; and an NMOS transistor having a source terminal coupled to the output block and a drain terminal coupled to the output terminal, and suitable for operating according to the second control signal provided from outside through a gate terminal of the NMOS transistor.

14. An amplifier, comprising:

a differential amplification block suitable for receiving and amplifying differential input signals;

an output block connected to the differential amplification block and suitable for determining an output signal according to a state of amplified signals outputted from the differential amplification block;

an output node connected to the output block and suitable for outputting the output signal;

an output range restriction block including at least one switch connected between the output node and the output block and suitable for switching on or off in response to a determination that the output signal is higher or lower than a target voltage; and an output range restriction release block suitable for releasing an output range restriction operation of the output range restriction block according to a first control signal or a second control signal.

* * * * *